United States Patent
Bollenbeck et al.

(10) Patent No.: US 9,529,067 B2
(45) Date of Patent: Dec. 27, 2016

(54) ARRANGEMENT FOR THE TRANSMISSION OF MAGNETIC RESONANCE SIGNALS

(71) Applicants: Jan Bollenbeck, Eggolsheim (DE); Ralph Oppelt, Uttenreuth (DE); Markus Vester, Nürnberg (DE)

(72) Inventors: Jan Bollenbeck, Eggolsheim (DE); Ralph Oppelt, Uttenreuth (DE); Markus Vester, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 642 days.

(21) Appl. No.: 14/018,139

(22) Filed: Sep. 4, 2013

(65) Prior Publication Data

US 2014/0062480 A1    Mar. 6, 2014

(30) Foreign Application Priority Data

Sep. 5, 2012  (DE) .................. 10 2012 215 726

(51) Int. Cl.
  *G01R 33/54* (2006.01)
  *G01R 33/36* (2006.01)
  *G01R 33/3415* (2006.01)

(52) U.S. Cl.
  CPC .......... *G01R 33/54* (2013.01); *G01R 33/3621* (2013.01); *G01R 33/3692* (2013.01); *G01R 33/3415* (2013.01)

(58) Field of Classification Search
  CPC .. G01R 33/54; G01R 33/3621; G01R 33/3692
  See application file for complete search history.

(56) References Cited

U.S. PATENT DOCUMENTS

| 6,791,322 B2 | 9/2004 | Vester |
| 6,822,445 B2 | 11/2004 | Vester |

(Continued)

FOREIGN PATENT DOCUMENTS

| CN | 1409125 A | 4/2003 |
| CN | 101073017 A | 11/2007 |

(Continued)

OTHER PUBLICATIONS

Chinese Office action for related Chinese Application No. 201310397232.0 dated Dec. 16, 2015, with English Translation.

(Continued)

*Primary Examiner* — Rodney Bonnette
(74) *Attorney, Agent, or Firm* — Lempia Summerfield Katz LLC (57) ABSTRACT

An arrangement for the transmission of magnetic resonance signals that are received with the aid of local coils is provided. The magnetic resonance signal is fed to an analog/digital converter and digitized by the analog/digital converter. The magnetic resonance signal is compressed in amplitude before being fed to the analog/digital converter, is low-pass filtered or band-pass filtered, and is expanded after digitization by the analog/digital converter. A clock rate that is higher by a factor $2^n$ than a sampling rate n of the analog/digital converter (ADC) is used for the digital expander. A digital equalizing filter for compensating for a filter transmission function in a transition range may also be used.

17 Claims, 5 Drawing Sheets

(56) References Cited

U.S. PATENT DOCUMENTS

| | | | |
|---|---|---|---|
| 6,844,730 B2* | 1/2005 | Feld | G01R 33/3621 |
| | | | 324/318 |
| 2003/0076105 A1 | 4/2003 | Feld et al. | |
| 2006/0066312 A1 | 3/2006 | Watkins et al. | |
| 2006/0100860 A1* | 5/2006 | Oppelt | H04B 1/66 |
| | | | 704/201 |
| 2009/0230966 A1 | 9/2009 | Ehnholm | |
| 2010/0117649 A1 | 5/2010 | Nakanishi et al. | |
| 2010/0260293 A1 | 10/2010 | Roeven | |
| 2011/0109315 A1 | 5/2011 | Biber et al. | |
| 2011/0227574 A1* | 9/2011 | Akita | G01R 33/3692 |
| | | | 324/322 |

FOREIGN PATENT DOCUMENTS

| | | | |
|---|---|---|---|
| CN | 101896832 A | 11/2010 | |
| CN | 102053233 A | 5/2011 | |
| DE | 10148442 A1 | 4/2003 | |
| DE | 10148462 C1 | 6/2003 | |
| JP | 2006102493 A | 4/2006 | |
| JP | 2010115256 A | 5/2010 | |

OTHER PUBLICATIONS

German Office Action cited in German Application No. 10 2012 215 726.3, mailed May 13, 2013.

* cited by examiner

Output signal of compressor C for two-tone modulation

FIG 7 ic resonance signals is provided. The magnetic resonance signal

ARRANGEMENT FOR THE TRANSMISSION OF MAGNETIC RESONANCE SIGNALS

This application claims the benefit of DE 10 2012 215 726.3, filed on Sep. 5, 2012, which is hereby incorporated by reference in its entirety.

BACKGROUND

The present embodiments relate to an arrangement for the transmission of magnetic resonance signals received with the aid of local coils.

Modern magnetic resonance units simultaneously receive a plurality of magnetic resonance (MR) signals via local coils that are positioned on patients. The local coils are part of a local coil array. The received magnetic resonance signals are preamplified, conducted from a central region of the magnetic resonance unit and fed to a shielded receiver, to be used at the shielded receiver for image processing.

Magnetic resonance signals have a high signal dynamic range, some of which covers more than 150 dBHz. In order to be able to process such signals without any perceptible deterioration of the signal-to-noise ratio, the components used to process the signal have an available dynamic range that is even more extended than the signal dynamic.

DE 101 48 442 C2 discloses a transmission method for magnetic resonance signals, the use of which results in greatly reduced dynamic requirements for analog/digital conversion of the receive path. The method is based on the fact that the receive signal amplitude is compressed by a compressor before the conversion. The signal amplitude is expanded again after the conversion. A linear transmission function of the overall system results.

The use of an analog amplitude compressor trades amplitude dynamic range for signal bandwidth. The compressed signal has a greatly expanded signal spectrum. In order to be able to achieve sufficiently exact signal expansion, the compressor output signal may be fed to the expander with as little distortion as possible to expand the output signal. Spectral clipping produces errors during expansion and therefore undesirable effects in the expanded output spectrum. This affects both harmonic components and intermodulation products.

The following problems therefore result. The filtering of harmonic components of the compressor output signal results in the formation of harmonic components in the expanded signal. If the expansion takes place in discrete time (e.g., digitally), the harmonic components appear due to backfolding in the first Nyquist band of sampling.

Figure 1:
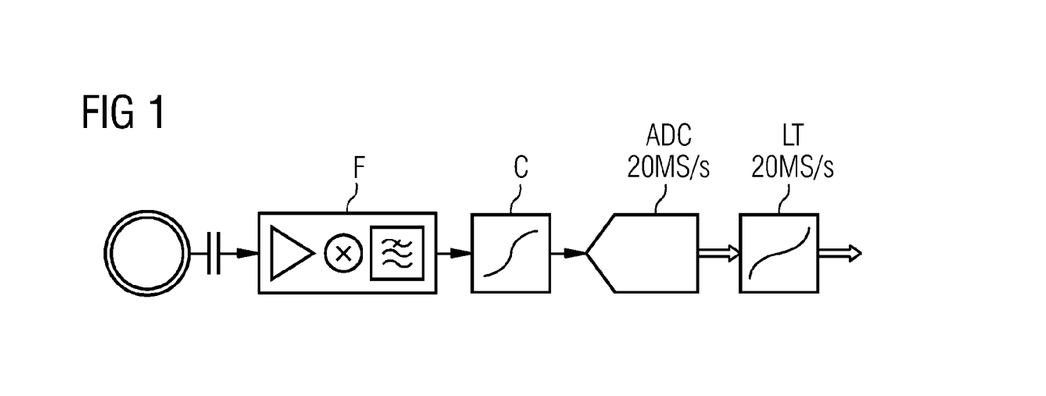
FIG. 1 shows a compander system without band limitation.
Figure 1B:
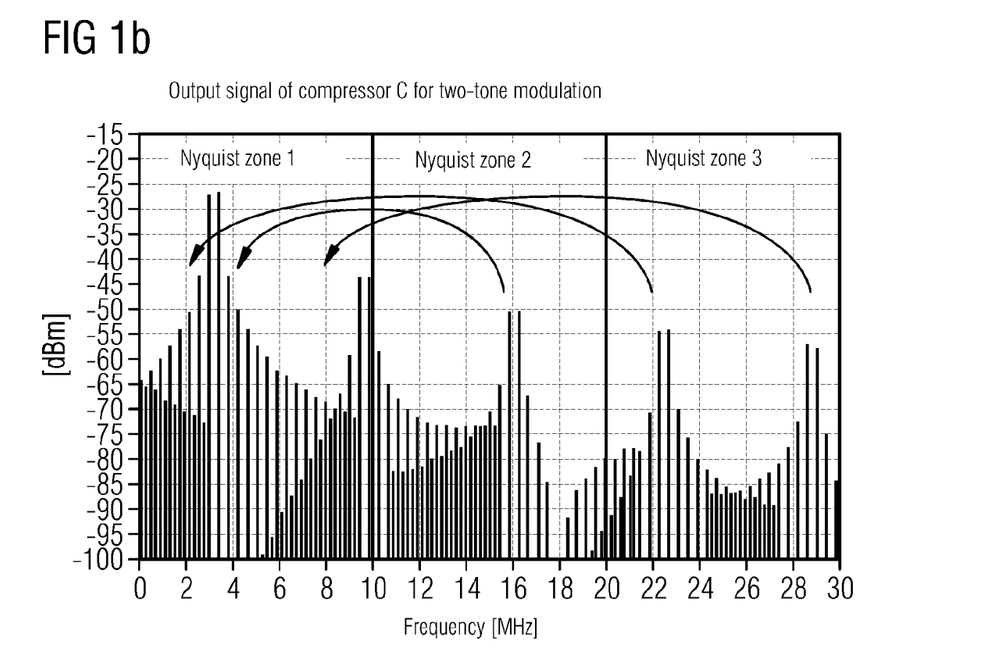
FIG. 1b shows an example of Nyquist zones 1 to 3 of a compressor output signal.

FIG. 1b shows an example of the Nyquist zones or bands 1 to 3, with the frequency in MHz shown on the x-axis, and the power level in decibel milliwatts shown on the y-axis.

Band limiting of the compressor output signal (e.g., filtering of intermodulation products) results in the formation of intermodulation products in the expanded signal.

These effects require the analog input bandwidth of the analog/digital converter or A/D converter (ADC) to be sufficiently large. If the sampling rate is not matched accordingly, this results in a significant reduction in the available dynamic due to interfolding of noise contributions from alias bands during sampling.

For reasons relating to structure or transmission (e.g., component availability, power requirement, bandwidth requirement for a radio transmission of the digital data), the sampling rate may not, however, be selected arbitrarily. If a radio transmission is inserted between compressor and ADC, the bandwidth requirement increases with the number of channels to be transmitted over practical limits.

In order to reduce the dynamic range to be processed by the ADC, a variable or switchable amplification may be inserted before the ADC. This has the disadvantage that amplification is preselected according to the maximum possible signal in each instance. If large signals are to be expected, amplification is reduced, and the quantization noise of the ADC moves to the foreground compared with the thermal noise from the patient.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a transmission method and facilities corresponding to the transmission method, by which the problems described above are overcome, are provided.

In one embodiment, a transmission method for a magnetic resonance signal is provided. The magnetic resonance signal is fed to an analog/digital converter (ADC) and is digitized by the analog/digital converter. The analog magnetic resonance signal is compressed in amplitude before being supplied to the analog/digital converter and is expanded after digitization by the analog/digital converter. The magnetic resonance signal is filtered at least in one frequency range after compression. A low-pass filter or band-pass filter may be used.

The spectral bandwidth of the compressed signal may be considerably reduced (e.g., from 50 MHz to 5 MHz) while at the same time satisfying the requirements relating to linearity and spectral purity of the expanded signal. This enlarges the dynamic range of the system due to the absence of noise interfolding.

The bandwidth of the compressor output signal is restricted as narrowly as possible. The combination of analog amplitude compression and subsequent band limiting allows the use of ADCs with a small bit depth.

The clock rate is increased after sampling and before expansion compared with the sampling rate of the analog/digital converter. A clock rate or data rate that is higher by a factor $2^n$ than the sampling rate of the ADC may be used for the digital expander (n=1, 2, 3, . . . ). The harmonic components mentioned in the introduction therefore remain in the baseband and may be filtered as a result.

A digital equalizing filter for compensating for the filter transmission function (e.g., in the transition range) may also be used.

In one development, a band-pass filtered noise signal may also be fed to the analog/digital converter. This dithering signal brings about a noise-type modulation of the sampling LSBs even with high compressor input signal levels (therefore reduced compressor amplification).

In one development, expansion takes place using a look-up table. The look-up table may include just an amplitude extension, for example, or also a phase correction.

In one development, the compressed magnetic resonance signal is transmitted in a wired manner before expansion.

In one development, the compressed magnetic resonance signal is transmitted at least partially in a wireless manner before expansion.

Such a transmission method may therefore be used in multichannel systems with wireless transmission, as wireless transmission uses a greatly reduced bandwidth.

In one embodiment, a coil arrangement includes a coil for detecting a magnet resonance signal, and a compressor for compressing the amplitude of the magnetic resonance signal. The compressor is disposed downstream of the coil. The coil arrangement also includes an analog/digital converter disposed downstream of the compressor. The coil arrangement includes an input element for inputting the compressed magnetic resonance signal into a transmission link. The input element is disposed downstream of the analog/digital converter. Disposed downstream of the compressor is a filter for filtering at least one frequency range of the compressed magnetic resonance signal. A low-pass filter or band-pass filter may be used for this filter.

In another embodiment, a detection circuit for detecting a magnetic resonance signal includes an expander and an output element for outputting the magnetic resonance signal from a transmission link disposed upstream of the expander. A unit for increasing a clock rate is disposed upstream of the expander.

In yet another embodiment, a magnetic resonance signal transmission device includes a coil arrangement and a detection circuit, as described above. The detection circuit is configured to be suitable for carrying out the transmission method. Such a magnetic resonance signal transmission device may be used in multichannel systems with wireless transmission, as wireless transmission uses a greatly reduced bandwidth. The advantages and embodiments cited in relation to the method apply in a similar manner to the coil arrangement and detection circuit and to the magnetic resonance signal transmission device.

BRIEF DESCRIPTION OF THE DRAWINGS

The examples cited below do not constitute any limitation of the invention.

DETAILED DESCRIPTION

Figure 4:
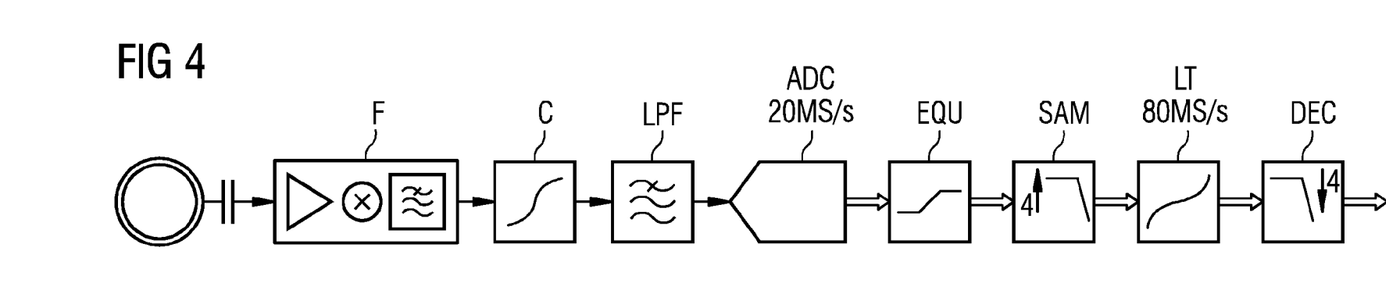
FIG. 4 shows one embodiment of a compander system with low-pass filtering and Nyquist sampling.
Figure 5:
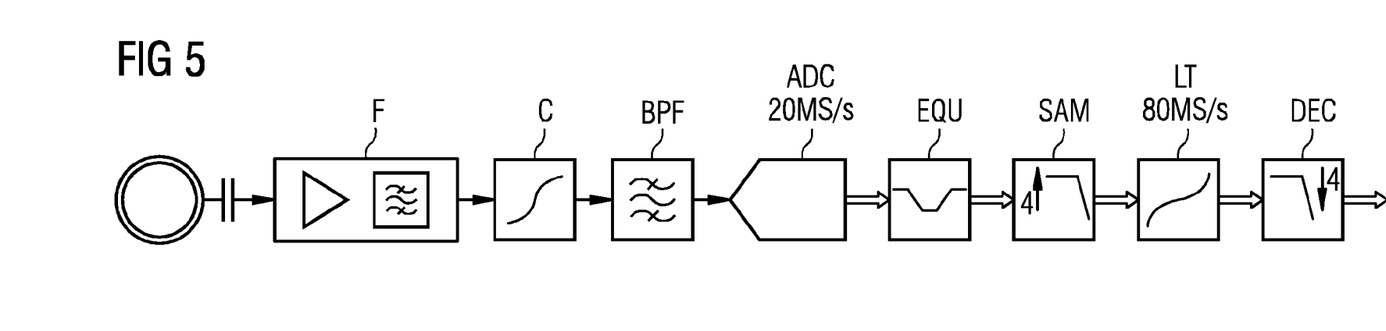
FIG. 5 shows one embodiment of a compander system with band-pass sampling.

The elements of an embodiment of a compander system are shown in accordance with FIG. 4. The elements include the following disposed in series: a front end F, a compressor C, a low-pass filter LPF, an analog/digital converter ADC, an equalizer EQU for frequency response correction, a unit SAM for up-sampling (e.g., data rate conversion) and interpolation, a look-up table LT and a unit DEC for decimation.

Harmonic components may occur during signal expansion and are folded into a first Nyquist sampling zone during sampling in discrete time. Disruptive interfolding is a function of a clock rate of the expander. The data or clock rate may be increased after sampling but before expansion (e.g., by the unit SAM for up-sampling and interpolation). The harmonic components therefore remain in the baseband and may be filtered before subsequent decimation.

This procedure is advantageous when the A/D converter ADC is disposed in the local coil. The sampling rate may be set low. With a high clock rate, expansion happens on the system side outside the local coil (e.g., after wireless data transmission). Power consumption within the local coil may thus be minimized.

Figure 2:
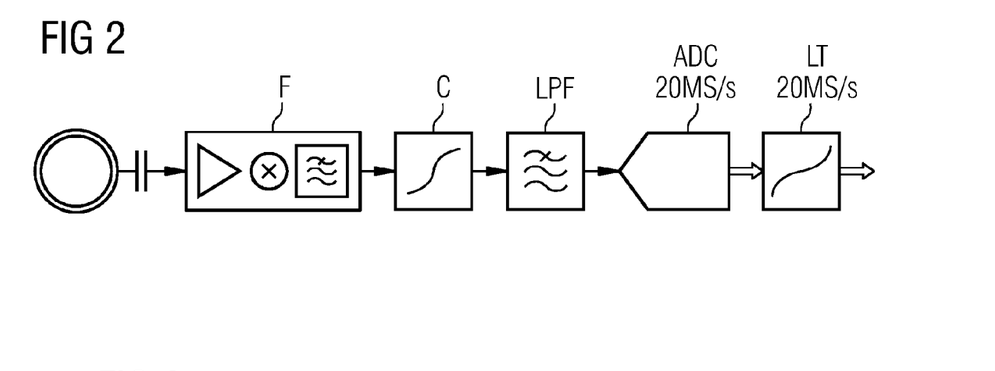
FIG. 2 shows one embodiment of a compander system with low-pass filtering and Nyquist sampling.

With reference to FIG. 2, disruptive intermodulation products result due to expansion during filtering (e.g., band-pass filtering or low-pass filtering of the compressed signal in the frequency range in which the filter transmission function changes from passage to the blocking range). Elimination of the intermodulation products does not take place or only takes place to an unsatisfactory degree, as the corresponding spectral components of the compressor output signal have been attenuated or removed. FIG. 2 shows examples from the Nyquist zones 1 to 3. This effect may be counteracted with filter frequency response compensation.

Figure 3:
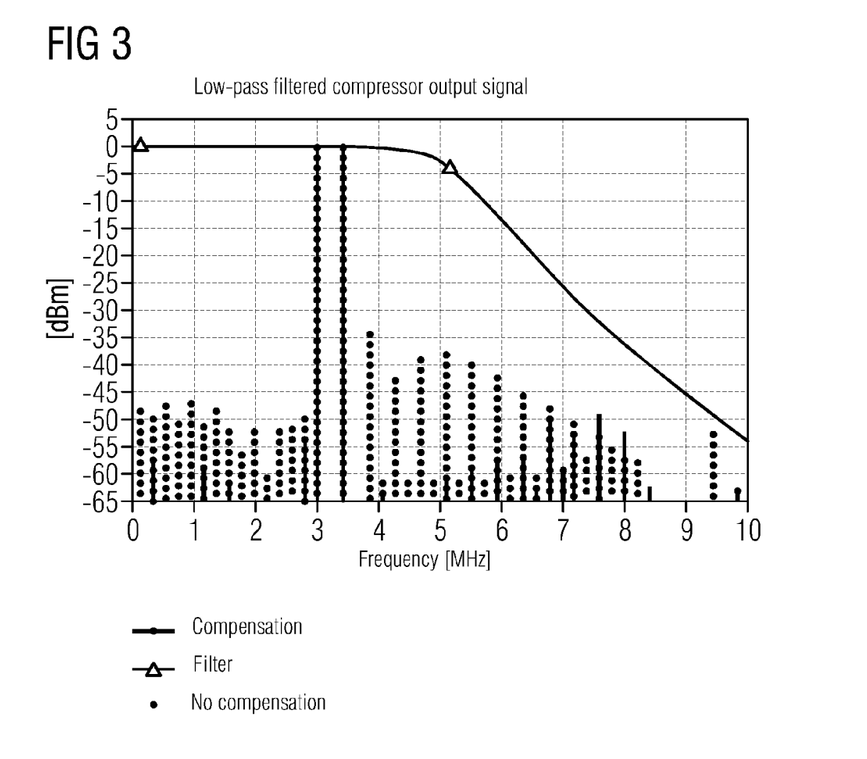
FIG. 3 shows exemplary effects of low-pass filtering.

In FIG. 3, the dotted lines show the resulting spectrum when there is no compensation, and the continuous lines show the resulting spectrum when there is compensation.

Any deviation from a smooth frequency response (e.g., a ripple in the filter transmission function) may be compensated for (e.g., by using surface acoustic wave (SAW) filters). Compensation may take place using an equalizer or equalizing filter in the digital range, as shown in FIG. 4. Compensation may take any frequency responses of the decimation filter that may be used into account. As the decimation filter is implemented in a digital manner, the relevant compensation (e.g., equalizing) is reproducible. Both the signal amplitude and the signal phase may be taken into account during compensation. Compensation takes place up to the frequency at which filter attenuation is achieved (e.g., 25 dB). The phase may only be compensated with respect to phase linearity, which results in a constant group delay.

The purpose of these measures is to restrict the bandwidth of the compressor output signal as narrowly as possible. The combination of analog amplitude compression and subsequent band limiting allows the use of ADCs with a small bit depth. Thus, a current 12 bit ADC is adequate for sampling a 3 Tesla MR signal.

In contrast, an 18 bit ADC would sample the full dynamic without compressor and without switchable amplification.

As the compressor is increasingly modulated, amplification decreases continuously after the use of compression. This also reduces the noise output at the ADC input. The noise voltage overlying the signal is thus not sufficient with high signal levels to modulate the small LSB stages during sampling. This results during passage through the dynamic range in undesirable deterministic stages in the output signal, and the quantization error is no longer stochastic (e.g., no longer evenly distributed with respect to probability density and spectral power density).

Figure 7:
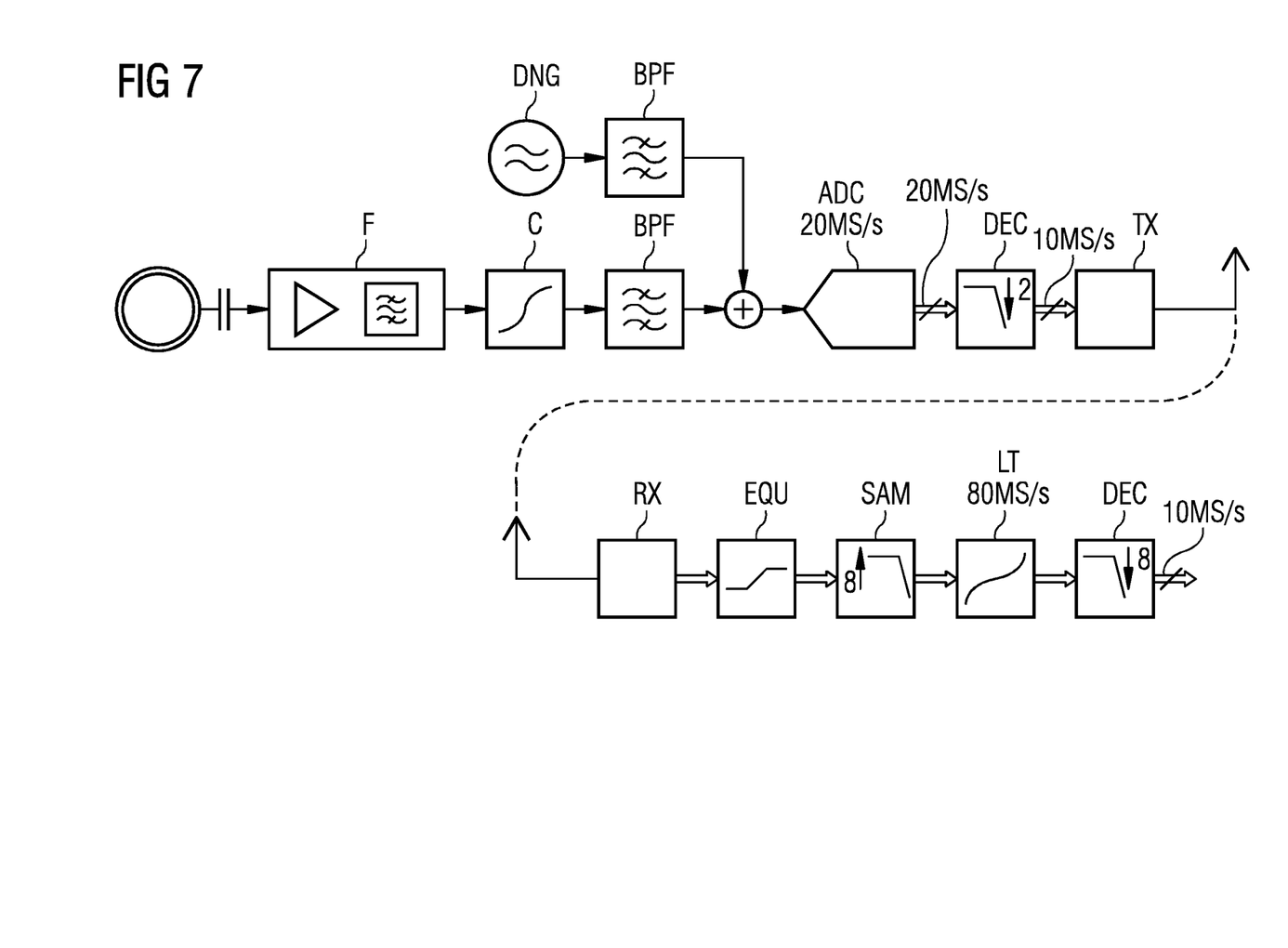
FIG. 7 shows one embodiment of a compander system with digital, wireless signal transmission.

As shown in FIG. 7, a noise signal band-pass filtered by a band-pass filter and referred to as "dithering" is fed to the ADC input. The spectral position of the noise band is selected so that the noise band does not overlap with the spectrum of the desired receive signal even after sampling.

Figure 6:
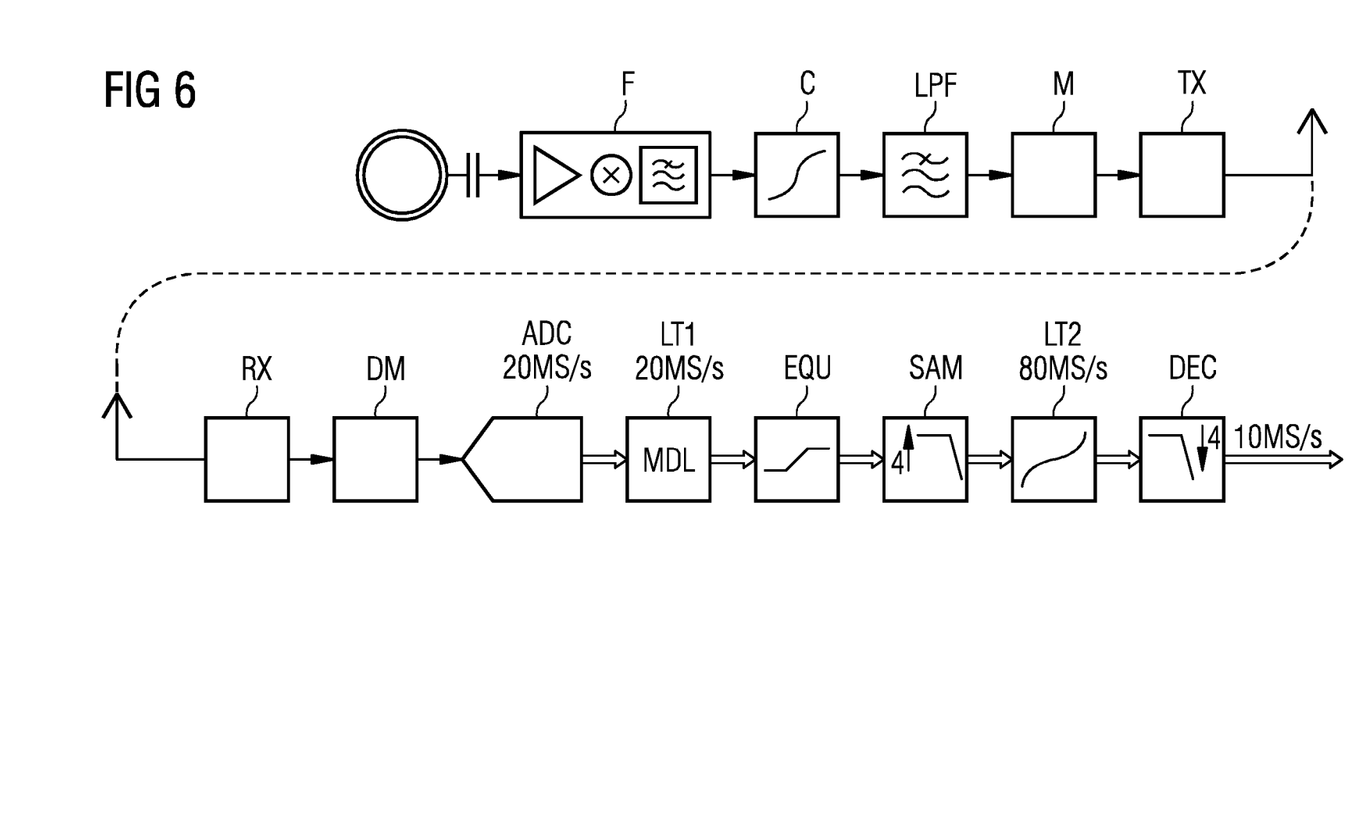
FIG. 6 shows one embodiment of a compander system with analog, wireless signal transmission.

FIG. 6 shows one embodiment of an arrangement for the analog, wireless transmission of an MR receive signal. In addition to the local coil element, the mobile part (e.g., local coil) includes an analog front end F including an amplifier, mixer and filter, the analog amplitude compressor C, which processes the signal in the intermediate frequency plane e.g. 3.2 MHz for 3 Tesla, a low-pass filter LPF and a transmit element for a wirelessly transmittable radio signal. The transmit element uses a modulator M to modulate the compressed, low-pass filtered intermediate frequency signal to a high-frequency carrier of the transmitter TX and emits this carrier via a transmit antenna.

As well as possible amplitude or single sideband modulation, frequency modulation, for example, is of interest, as increasing signal to noise gain (S/N) is achieved with an increasing modulation index h=DF/fmod. DF is the frequency deviation (e.g., the maximum difference upward or downward from the carrier frequency), and fmod is the modulation frequency (e.g., the 3.2 MHz intermediate frequency position). According to the relationship formulated by J. R. Carson, the occupied bandwidth of the frequency-modulated signal is B=2(h+2)fmod=2(DF+2fmod).

It is advantageous if the maximum frequency of the modulation signal (e.g., the output signal of the compressor) may be limited by band-pass filtering or low-pass filtering. fmod, max=5 MHz, for example. The bandwidth is therefore limited to ±1.8 MHz around the 3.2 MHz intermediate frequency. DF=50 MHz deviation would give a modulation index of h=10, and an occupied bandwidth of B=120 MHz. If the compressor output signal were not band-limited, so many of the only odd-number harmonics would be included that the spectral sub-powers drop to negligible values. Only the inclusion of the first ten harmonics would provide fmod, max=95 MHz. An occupied bandwidth of B=2.28 GHz would then result for the same modulation index (e.g., for the same S/N gain), requiring a very high carrier frequency and, for example, making multichannel systems unattractive for the frequency-division multiplex method.

On the system side, the modulated high frequency signal is received by a receive antenna connected to the input of the receiver RX and demodulated in a detection circuit. The receive signal is Nyquist sampled. A first look-up table (e.g., LT1) may be used to compensate for any non-linearity of the frequency modulator M and frequency demodulator DM. The following equalizing filter EQU compensates for the frequency response of coil-side signal processing (e.g., analog low-pass filter).

The digital amplitude expander embodied as the second look-up table (e.g., LT2) operates at a raised clock rate of 80 MS/s to prevent interfolding of resulting harmonic components. The two look-up tables may also be combined into a common look-up table. After a decimation stage DEC, the data is available at 10 MS/s for further processing.

FIG. 7 shows a schematic diagram of one embodiment of an arrangement for the digital, wireless transmission of an MR receive signal. In addition to the local coil element, the mobile part (e.g., local coil) includes an analog front end F (e.g., amplifier, filter), the analog amplitude compressor C, which may process the signal in the high frequency plane (e.g., 123.2 MHz for 3 T), a band-pass filter BPF, a noise signal generator DNG (e.g., a dither noise generator), an A/D converter ADC, a data rate decimation stage DEC and a (high frequency) transmit element TX.

The band-pass filter is dimensioned such that the passage frequency band only spans one Nyquist zone of the sampling that follows. When sampling at 20 MS/s, a 3 Tesla MR receive signal falls within Nyquist zone number 13 at 123.3 MHz. Spectral signal components such as noise, which do not fall within this frequency band of 120 to 130 MHz, are folded into the baseband by sampling and may be suppressed, for example, by at least −30 dB.

A spectrally band-limited noise signal (e.g., the dithering signal) is fed into the interface between compressor and ADC. This signal brings about a noise-type modulation of the sampling LSBs even with high compressor input signal levels (e.g., therefore reduced compressor amplification). The spectral position of the noise signal (e.g., 3 Tesla receive signal at 123.2 MHz) may be selected such that the spectral position of the noise signal comes to lie in the baseband in the 5 MHz to 10 MHz range after sampling. The noise signal is suppressed by the following decimation filter and does not result in any impairment of the receive signal (e.g., no loss in the signal to noise ratio). The noise band may thus lie in one of the bands FS*[n+(¼ . . . ¾)], as long as this range falls within the analog input bandwidth of the ADC. The noise bands may at least partially cover two adjacent Nyquist bands for sampling according to the dimensioning rule. Thus, the band-pass filter may be designed with maximum width behind the noise generator DNG. The necessary noise voltage is generated with the minimum noise power density possible. This allows the potential disruption to be minimized. A range from 25 MHz to 35 MHz may be provided.

After sampling (e.g., band-pass undersampling), the receive signal drops to 3.2 MHz. The signal may be limited spectrally to 0 to 5 MHz and then be decimated to 10 MS/s data rates. The low-pass limiting effect of the decimation filter causes the noise signal to be isolated from the receive signal.

A data stream at 120 Mb/s results with an ADC bit depth of 12 bits. The following high frequency transmitter modulates the digital data to a high frequency carrier and emits this via an antenna. On the system side, the modulated high-frequency signal is received by a receive antenna and the receiver RX and is demodulated in a detection circuit or in the demodulator of the receiver. The following equalizing filter compensates for the frequency response of coil-side signal processing by the analog band-pass filter and by the digital decimation filter. The digital amplitude expander embodied as a look-up table LT operates at a raised clock rate of 80 MS/s to prevent interfolding of resulting harmonic components. After a decimation stage, the data is available at 10 MS/s for further processing.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A transmission method for a magnetic resonance signal, the transmission method comprising:
compressing the magnetic resonance signal in amplitude;
filtering at least one frequency range of the compressed magnetic resonance signal;
feeding the filtered and compressed magnetic resonance signal in analog form to an analog/digital converter;

digitizing, with the analog/digital converter, the analog magnetic resonance signal; and expanding the digitized magnetic resonance signal, wherein a clock rate after sampling and before the expanding is higher than a sampling rate of the analog/digital converter.

2. The transmission method as claimed in claim 1, wherein the filtering comprises filtering with a band-pass filter or a low-pass filter.

3. The transmission method as claimed in claim 1, wherein the clock rate during the expanding is higher by a factor $2^n$ than the sampling rate n of the analog/digital converter, where n is a whole-number natural integer.

4. The transmission method as claimed in claim 1, further comprising feeding a band-pass filtered noise signal to the analog/digital converter.

5. The transmission method as claimed in claim 1, further comprising using a digital equalizer filter before the expanding.

6. The transmission method as claimed in claim 1, wherein the expanding comprises expanding using a look-up table.

7. The transmission method as claimed in claim 1, further comprising transmitting the compressed magnetic resonance signal in a wired manner before the expanding.

8. The transmission method as claimed in claim 1, further comprising transmitting the compressed magnetic resonance signal at least partially in a wireless manner before the expanding.

9. A coil arrangement comprising:
   a coil operable to detect a magnetic resonance signal;
   a compressor operable to compress an amplitude of the magnetic resonance signal, the compressor being disposed downstream of the coil;
   a band-pass filter operable to filter at least one frequency range of the compressed magnetic resonance signal, the band-pass filter being disposed downstream of the compressor;
   an analog/digital converter disposed downstream of the band-pass filter, wherein a filtered and compressed magnetic resonance signal is configured to be fed to the analog/digital converter; and
   an input element operable to input the compressed magnetic resonance signal into a transmission link, the input element being disposed downstream of the analog/digital converter.

10. The coil arrangement as claimed in claim 9, wherein the input element is configured as a transmit element for a wirelessly transmittable radio signal.

11. A detection circuit for detecting a magnetic resonance signal, the detection circuit comprising:
    an expander;
    an output element operable to output the magnetic resonance signal from a transmission link disposed upstream of the expander; and
    a unit configured to increase a clock rate, the unit being disposed upstream of the expander.

12. The detection circuit as claimed in claim 11, wherein the expander is configured as a look-up table.

13. The detection circuit as claimed in claim 11, further comprising an equalizing filter disposed upstream of the unit.

14. The detection circuit as claimed in claim 11, wherein the output element is configured as a receive element for a wirelessly transmittable radio signal.

15. The detection circuit as claimed in claim 14, wherein the expander is configured as a look-up table.

16. The detection circuit as claimed in claim 14, further comprising an equalizing filter disposed upstream of the unit.

17. A magnetic resonance signal transmission device comprising:
    a coil arrangement comprising:
      a coil operable to detect a magnetic resonance signal;
      a compressor operable to compress an amplitude of the magnetic resonance signal, the compressor being disposed downstream of the coil;
      an analog/digital converter disposed downstream of the compressor;
      an input element operable to input the compressed magnetic resonance signal into a transmission link, the input element being disposed downstream of the analog/digital converter; and
      a filter operable to filter at least one frequency range of the compressed magnetic resonance signal, the filter being disposed downstream of the compressor; and
    a detection circuit comprising:
      an expander;
      an output element operable to output the magnetic resonance signal from a transmission link disposed upstream of the expander; and
      a unit configured to increase a clock rate, the unit being disposed downstream of the analog/digital converter and upstream of the expander,
    wherein the detection circuit is configured to:
      compress the magnetic resonance signal in amplitude before being fed to the analog/digital converter;
      filter at least one frequency range of the compressed magnetic resonance signal;
      feed the filtered and compressed magnetic resonance signal in analog form to the analog/digital converter;
      digitize, with the analog/digital converter, the analog magnetic resonance signal; and
      expand the digitized magnetic resonance signal.

* * * * *